US007075124B2

(12) United States Patent
Albrecht et al.

(10) Patent No.: US 7,075,124 B2
(45) Date of Patent: Jul. 11, 2006

(54) RADIATION-SENSITIVE SEMICONDUCTOR BODY HAVING AN INTEGRATED FILTER LAYER

(75) Inventors: Tony Albrecht, Bad Abbach (DE); Peter Brick, Regensburg (DE); Glenn-Yves Plaine, Regensburg (DE); Marc Philippens, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/909,036

(22) Filed: Jul. 30, 2004

(65) Prior Publication Data

US 2005/0056904 A1 Mar. 17, 2005

(30) Foreign Application Priority Data

Jul. 31, 2003 (DE) ................................ 103 35 079
Sep. 5, 2003 (DE) ................................ 103 41 086

(51) Int. Cl.
*H01L 31/248* (2006.01)

(52) U.S. Cl. ...................... 257/184; 257/431; 257/440; 257/462; 359/248

(58) Field of Classification Search ................ 257/184; 359/248
See application file for complete search history.

(56) References Cited

U.S. PATENT DOCUMENTS 5,315,128 A * 5/1994 Hunt et al. .................. 257/16
5,329,136 A 7/1994 Goossen
5,543,628 A * 8/1996 Chow et al. .................. 257/17
5,670,385 A 9/1997 Chu
6,043,517 A * 3/2000 Presting et al. ............. 257/184
6,380,531 B1 4/2002 Sugihwo et al.
6,399,967 B1 6/2002 Matsuda
2003/0155625 A1 8/2003 Kato et al.

FOREIGN PATENT DOCUMENTS

DE 694 25 192 T2 12/1994
DE 100 19 089 C1 4/2000
DE 102 03 875 A1 10/2002
JP 2-148770 A 6/1990
WO WO 01/78155 A3 4/2001

* cited by examiner

*Primary Examiner*—Eddie Lee
*Assistant Examiner*—Andrew O. Arena
(74) *Attorney, Agent, or Firm*—Cohen, Pontani, Lieberman & Pavane

(57) ABSTRACT

A radiation-sensitive semiconductor body which has at least one radiation-absorbent active area (2) between at least two contact layers (6, 7) and which receives electromagnetic radiation in a wavelength range between $\lambda_1$ and $\lambda_2$ where $\lambda_2>\lambda_1$. A filter layer (5) is arranged between the active area (2) and a radiation input surface (9). The active area (2) detects electromagnetic radiation at a wavelength below $\lambda_2$. The filter layer (5) absorbs electromagnetic radiation at a wavelength below $\lambda_1$, and passes electromagnetic radiation at a wavelength above $\lambda_1$.

16 Claims, 3 Drawing Sheets

8 9 6 6 5a 5 4 2 3 1 7 10

Energie (a.u.)
9
13
5a
5
11
4
2
8
3
1
12
10

Al-Konzentration
In-Konzentration
100
80
60
40
20
0
-20
-40
9
13
5a
5
4
2
3
1

RADIATION-SENSITIVE SEMICONDUCTOR BODY HAVING AN INTEGRATED FILTER LAYER

RELATED APPLICATIONS

This patent application claims the priority of German patent applications 10335079.9 and 10341086.4-33 filed Sep. 5, 2003 and Jul. 31, 2003, respectively, the disclosure content of which is hereby incorporated by reference.

FIELD OF THE INVENTION

The invention relates to a radiation-sensitive semiconductor body which has at least one radiation-absorbent active area that receives electromagnetic radiation in a wavelength range between $\lambda_1$ and $\lambda_2$, where $\lambda_2$ is greater than $\lambda_1$. It relates in particular to a semiconductor body which is in the form of a photodiode or a phototransistor.

BACKGROUND OF THE INVENTION

Environmental light or stray light normally has a negative influence on the performance of radiation-sensitive components in which semiconductor bodies of the type mentioned above are integrated. When signals or data are being transmitted optically through free space, the signal to be detected is very frequently subject to interference or corruption by environmental light or stray light. Optical filters are therefore often installed upstream of the detector, in order to separate the signal from this interference light. Alternatively or additionally, the signal can be electronically processed, but this involves even greater complexity. Such external measures result in a greater consumption of time and costs.

SUMMARY OF THE INVENTION

One object of the present invention is to provide a radiation-sensitive semiconductor body of the type mentioned above with improved protection against interference and corruption of the signal to be detected, and which can be reproduced without major technical effort.

This and other objects are attained in accordance with one aspect of the invention directed to a radiation-sensitive semiconductor body having at least one radiation-absorbent active area has a filter layer which is arranged between the active area and a radiation input face. The active area detects only electromagnetic radiation at a wavelength below $\lambda_2$. The filter layer absorbs electromagnetic radiation at a wavelength below $\lambda_1$, and passes electromagnetic radiation at a wavelength above $\lambda_1$. As a result of the combined effect of the active area and of the filter layer, the semiconductor body receives electromagnetic radiation in a wavelength range between $\lambda_1$ and $\lambda_2$, where $\lambda_2>\lambda_1$.

In one embodiment of the invention, the radiation which is absorbed by the filter layer is preferably converted into radiation at a wavelength above $\lambda_2$, which is thus not detected by the active area.

In the following text, radiation at a wavelength above $\lambda_2$ is referred to as long-wave radiation, and radiation at a wavelength below $\lambda_1$ is referred to as short-wave radiation. The same also applies to short-wave and long-wave light.

A radiation input surface is preferably at least partially formed by the surface of the filter layer facing away from the active area. The contact layer at the side of the radiation input surface is preferably structured and may be applied to the filter layer, at least in places. This results in a component which is more compact than comparable conventional components.

In one preferred embodiment of the invention, the active area is arranged between two mirrors, with the mirror which is arranged between the active area and the radiation input surface being partially transparent. This partially transparent mirror is preferably partially transparent at least for radiation in the wavelength range between $\lambda_1$ and $\lambda_2$. The mirrors are preferably in the form of Bragg mirrors. The signal to be detected is advantageously amplified by constructive interference caused by the Bragg mirrors. Furthermore, the mirrors may be arranged around the active area such that they form a resonator which is tuned to radiation in the wavelength range between $\lambda_1$ and $\lambda_2$. A resonator such as this has the advantage that it is possible to produce a component which is more sensitive in the desired wavelength range, specifically between $\lambda_1$ and $\lambda_2$. The mirrors are preferably made of semiconductor material.

In a further embodiment, the active area may be made of a semiconductor material, and may be in the form of a quantum well structure. A quantum well structure in the active area advantageously allows the spectral sensitivity and selectivity to be increased.

The filter layer is preferably in the form of a layer sequence which, furthermore, is preferably made of different semiconductor materials. The filter layer can then advantageously be grown in the same epitaxial production step as the active area located underneath it, and possibly the mirrors. This means that the active area, the filter layer and, possibly, the two mirrors can be grown on a substrate in one epitaxy step. This makes it possible to save production time and costs.

In one preferred embodiment, the filter layer has a quantum well structure. The light that is absorbed in the filter layer produces charge carriers which are trapped in the quantum well structure before re-emission, where they are energetically relaxed. These charge carriers recombine in the quantum well structure and produce radiation, preferably at a wavelength above $\lambda_2$, that is to say long-wave radiation. This long-wave radiation is not significantly absorbed by another layer or structure in the semiconductor body. The long-wave radiation thus leaves the semiconductor body without being detected. The filter layer in this case acts as a cut-off filter, which absorbs short-wave light at a wavelength below $\lambda_1$, and passes long-wave light. In conjunction with the active layer, a bandpass filter is thus formed, which filters out interference light, so that only light at a wavelength between $\lambda_1$ and $\lambda_2$ is detected.

In one particularly preferred embodiment, the semiconductor body is in the form of a photodiode or a phototransistor.

BRIEF DESCRIPTION OF THE DRAWINGS

Further features and advantages will become evident from the following description of one exemplary embodiment in conjunction with FIGS. 1 to 3, in which.

DETAILED DESCRIPTION OF THE DRAWINGS

Identical elements or elements having the same effect are provided with the same reference symbols in the figures. In order to assist understanding, the thicknesses of the layers, in particular, are not shown true to scale in the figures.

Figure 1:
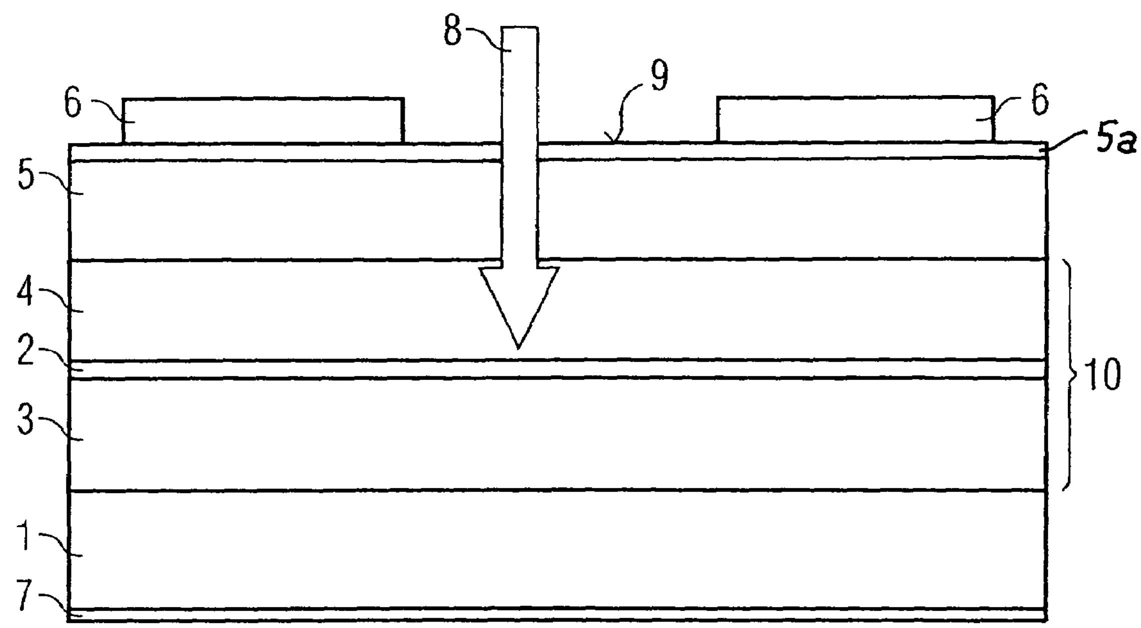
FIG. 1 shows a schematic sectional view of the exemplary embodiment of a semiconductor body according to the invention.

The semiconductor body illustrated in FIG. 1 is, by way of example, in the form of a resonant photodiode. The semiconductor body has an active area 2 which, for example, has a quantum well structure with a number of gallium arsenide quantum wells. The active area 2 is preferably arranged between two mirrors 3, 4. The mirrors 3, 4 may be in the form of semiconductor Bragg mirrors which, for example, have a number of $Al_{0.2}Ga_{0.8}As/Al_{0.9}Ga_{0.1}As$ periods. The mirror 4 is preferably partially transparent, at least for the signal to be detected, and, for example, is p-doped, with the mirror 3 being correspondingly n-doped. The two mirrors 3, 4 form a resonator 10 which is accurately tuned to the light in the signal to be detected. By way of example, the mirror 3 has 36 periods, and the mirror 4 has 10 periods. The radiation which is absorbed in the active area 2 produces free charge carriers, which lead to a photocurrent in an electrical field.

A filter layer 5 is preferably grown on the mirror 4, and is composed of a material which is very largely transparent for the light in the signal to be detected. A filter layer 5 based on $Al_{0.1}Ga_{0.9}As$ may be used for this purpose, depending on the wavelength range. The filter layer 5 is preferably grown in the same epitaxy step as the active area 2.

Short-wave light is very largely absorbed in the filter layer 5. Before re-emission, the charge carriers which are produced and are also located in this filter layer 5 are trapped in quantum wells, where they are energetically relaxed. By way of example, the quantum well structure is composed of $In_{0.2}Ga_{0.8}As$. These charge carriers recombine in the quantum wells, and produce long-wave radiation which cannot be significantly absorbed by any other layer in the semiconductor body.

Alternatively, the recombination of the charge carriers which are produced may take place via surface states. In this case, no radiation is generally emitted. The recombination via surface states is possible in particular if the filter layer 5 is relatively thin, that is to say in the order of magnitude of up to $10^{-6}$ m. If the filter layer 5 is relatively thin, there is a higher probability of the charge carriers reaching the surface, and being combined there via surface states.

A contact layer 6 is applied to the filter layer 5. The contact layer 6 is preferably structured. In this example, the contact layer 6 is based on gold and zinc (Au:Zn) and is p-doped. The surfaces of the filter layer 5 which are not covered by the contact layer 6 form the radiation input surface 9. The signal to be detected is indicated by the arrow 8.

The mirror 3 is arranged on a substrate 1 which, for example, contains gallium arsenide. The substrate 1 is preferably electrically conductive. A contact layer 7 is applied to that surface of the substrate 1 which faces away from the mirror 3. By way of example, the contact layer 7 is applied over the entire surface. In this example, the contact layer 7 is n-doped and contains a gold germanium alloy.

Figure 2:
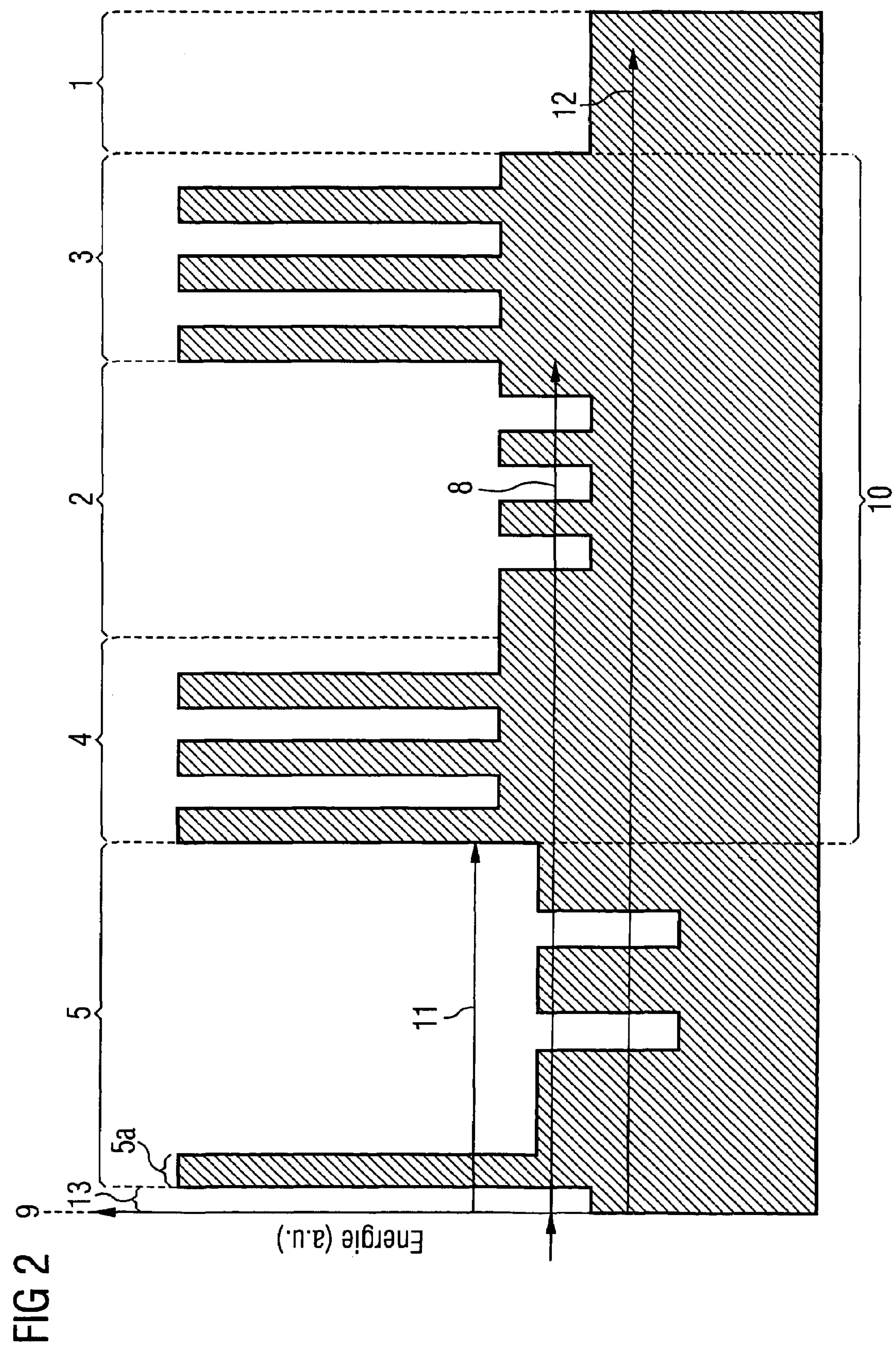
FIG. 2 shows a diagram of the band gaps in the various layers of the semiconductor body from the radiation input surface to the substrate.

FIG. 2 shows the bandgaps of the various layers in the semiconductor body. Bandgaps are applied in the opposite direction with respect to the layer sequence, which is illustrated along the horizontal axis.

Apart from a cap layer 13, which is arranged on the filter layer 5, the semiconductor body illustrated in FIG. 2 is constructed in the same way as the exemplary embodiment illustrated in FIG. 1. The cap layer 13 is formed, for example, from gallium arsenide and is very thin (in the order of magnitude of $10^{-9}$ m). It is used as protection against oxidation of the filter layer 5. The filter layer 5 generally contains relatively high concentrations of aluminum, which can oxidize rapidly in an air environment. The cap layer 13 preferably contains no aluminum components, or scarcely any aluminum components, and thus prevents the oxidation of aluminum at the air/semiconductor boundary surface. Such oxidation can lead to interference with the electrical characteristics of the semiconductor layer sequence.

The arrow 11 symbolically indicates short-wave light. The short-wave light 11 enters the semiconductor body as far as the filter layer 5. Here, the short-wave light 11 is largely absorbed and, for example, is converted to long-wave light by the quantum well structure in the filter layer 5. Optionally, the filter layer 5 may have a semiconductor layer 5*a* applied to it acting as a high energy barrier for the charge carriers on the surface facing the radiation input surface 9. High energy barrier 5*a* hinders charge carriers from reaching the surface 9. The rate of surface recombination is, therefore, reduced and the efficiency of the quantum well structure is enhanced. An energy barrier 5*a* such as this generally contains a very much higher aluminum concentration than the rest of the filter layer 5. In FIG. 2, the quantum well structures in the filter layer 5 and in the active area 2 are illustrated by large vertical bandgaps.

Long-wave light is illustrated symbolically by the arrow 12. The long-wave light comprises the light converted by means of the filter layer 5 as well as long-wave environmental light, and is largely passed through the semiconductor body. The radiation to be detected at a wavelength between $\lambda_1$ and $\lambda_2$ is indicated by the arrow 8. The radiation 8 is largely passed through the filter layer 5 and the partially reflective mirror 4. The resonant wavelength of the resonator 10 formed by means of the mirrors 4, 3 essentially corresponds to the wavelength of the radiation 8.

Figure 3:
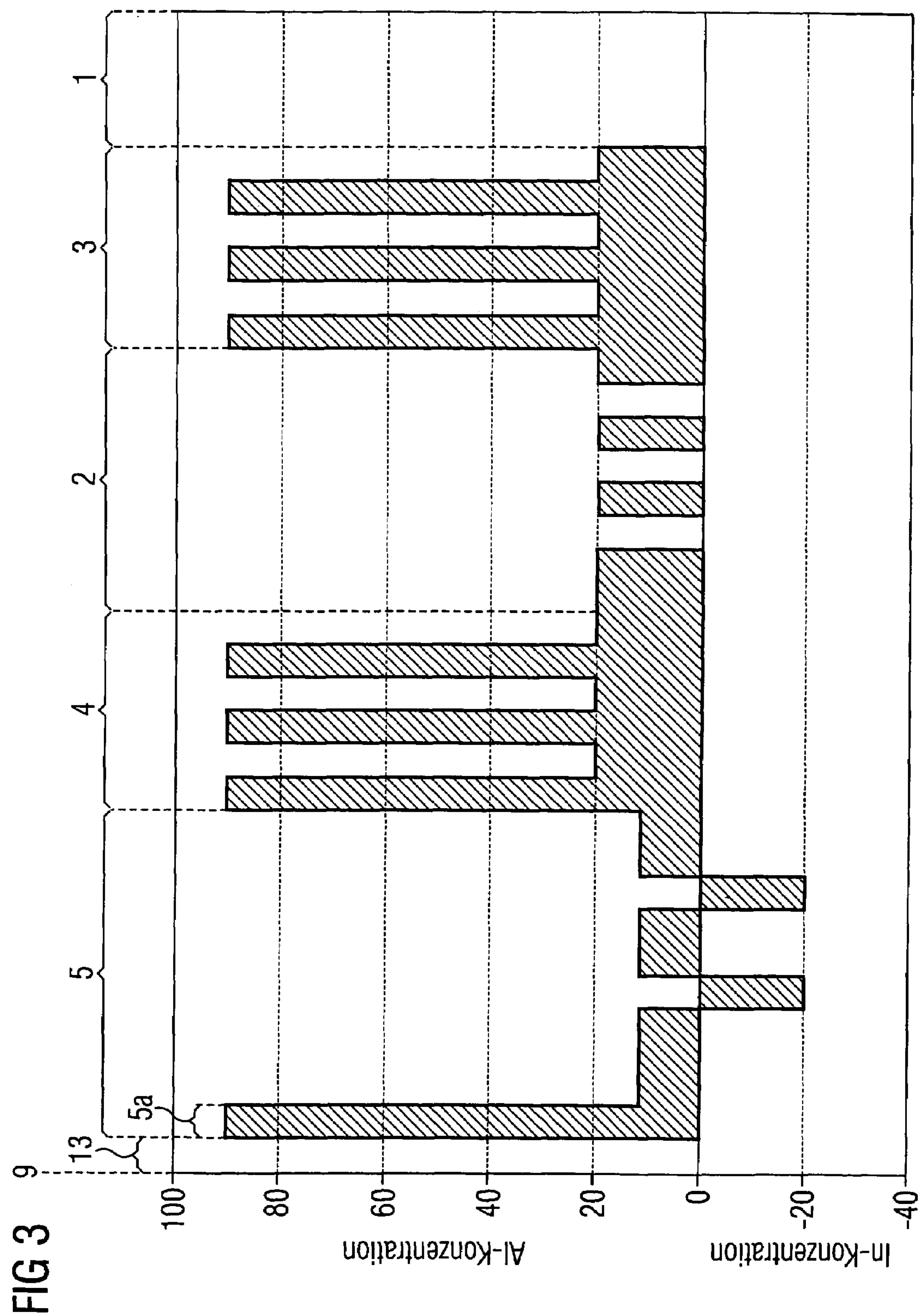
FIG. 3 shows a diagram of the indium and aluminum concentrations in the various layers of the semiconductor body from the radiation input surface to the substrate.

By way of example, FIG. 3 shows the indium and aluminum concentrations of the layers in the same semiconductor body as that illustrated in FIG. 2. As can be seen from FIG. 3 in conjunction with FIG. 2, a higher aluminum concentration corresponds to a greater bandgap. Conversely, a higher indium concentration corresponds to a reduced bandgap. The wavelength range between $\lambda_1$ and $\lambda_2$ can be adjusted via the bandgap so that the semiconductor body acting as a detector, for example, can be adapted to the wavelength of a transmitter.

The scope of protection of the invention is not restricted by the description of the invention on the basis of the exemplary embodiments. In fact, the invention covers any new feature as well as any combination of features, in particular including any combination of features in the patent claims, even if this combination is not explicitly stated in the patent claims or in the example.

The invention claimed is:

1. A radiation-sensitive semiconductor body which has at least one radiation-absorbent active area and which receives electromagnetic radiation in a wavelength range between $\lambda_1$ and $\lambda_2$, where $\lambda_2>\lambda_1$, wherein the semiconductor body has a filter layer between the active area and a radiation input surface, with the active area detecting electromagnetic radiation at a wavelength below $\lambda_2$, the filter layer absorbing electromagnetic radiation below a wavelength $\lambda_1$ and converting the absorbed radiation to light at a wavelength above $\lambda_2$, and the filter layer passing electromagnetic radiation at a wavelength above $\lambda_1$.

2. The semiconductor body as claimed in claim 1, wherein the filter layer has at least one quantum well structure.

3. The semiconductor body as claimed in claim 1, wherein the radiation input surface is formed by a surface of the filter layer facing away from the active area, or by a semiconductor layer applied to the filter layer.

4. The semiconductor body as claimed in claim 1, wherein the filter layer is comprises a semiconductor layer sequence.

5. The semiconductor body as claimed in claim 1, wherein the active area comprises a quantum well structure.

6. The semiconductor body as claimed in claim 1, wherein a first contact layer, which is arranged on the side of the active area facing the radiation input surface, is applied at least partially to the filter layer.

7. The semiconductor body as claimed in claim 1, wherein a substrate is arranged between the active area and a second contact layer, and the second contact layer is applied to the semiconductor body on that side of the active area which faces away from the radiation input surface.

8. The semiconductor body as claimed in claim 7, wherein the substrate is electrically conductive.

9. The semiconductor body as claimed in claim 1, wherein the active area is arranged between two mirrors, with the mirror which is arranged between the active area and the radiation input surface being partially transparent.

10. The semiconductor body as claimed in claim 9, wherein the mirror which is arranged between the active area and the radiation input surface is partially transparent, at least for radiation in the wavelength range between $\lambda_1$ and $\lambda_2$.

11. The semiconductor body as claimed in claim 9, wherein the two mirrors comprise Bragg mirrors.

12. The semiconductor body as claimed in claim 9, wherein the two mirrors form a resonator which is tuned to radiation in the wavelength range between $\lambda_1$ and $\lambda_2$.

13. The semiconductor body as claimed in claim 1, wherein one of the two mirrors is arranged between the filter layer and the active area.

14. The semiconductor body as claimed in claim 1, wherein the two mirrors contain a semiconductor material.

15. The semiconductor body as claimed in claim 1, wherein the semiconductor body comprises a photodiode or a phototransistor.

16. The semiconductor body as claimed in claim 2, wherein the radiation absorbed in the filter layer produces charge carriers which are trapped in the at least one quantum well structure before re-emission, the charge carriers being energetically relaxed in the quantum well.

* * * * *